United States Patent [19]
Blanchard

[11] Patent Number: 5,708,289
[45] Date of Patent: Jan. 13, 1998

[54] PAD PROTECTION DIODE STRUCTURE

[75] Inventor: Richard A. Blanchard, Los Altos, Calif.

[73] Assignee: SGS-Thomson Microelectronics, Inc., Carrollton, Tex.

[21] Appl. No.: 608,642

[22] Filed: Feb. 29, 1996

[51] Int. Cl.$^6$ .................................. H01L 23/62
[52] U.S. Cl. ................ 257/355; 257/356; 257/362; 257/546
[58] Field of Search ................ 257/355, 356, 257/362, 363, 357, 546, 603

[56] References Cited

U.S. PATENT DOCUMENTS 4,736,271  4/1988  Mack et al. .................. 257/353

FOREIGN PATENT DOCUMENTS

| 0 401 135 | 12/1990 | European Pat. Off. | 257/362 |
|---|---|---|---|
| 58-58768 | 4/1983 | Japan | 257/362 |
| 60-233846 | 11/1985 | Japan | 257/362 |
| 1 214 055 | 8/1989 | Japan | 257/362 |
| 1-214055 | 8/1989 | Japan | 257/362 |
| 1293560 | 11/1989 | Japan | 257/362 |

OTHER PUBLICATIONS

French Search Report from French Patent Application 92 08280, filed Jun. 25, 1992.

International Electron Devices Meeting, Dec. 1990, San Francisco, CA US, pp. 799–802, XP279627, M.P. Masaquelier et al., "Method Of Internal Overvoltage Protection and Current Limit For A Lateral PNP Transistor Formed by Polysilicon Self–Aligned Emitter and Base, with Extended Collector".

Patent Abstracts of Japan, vol. 13, No. 220 (E–762) (2568) May 23, 1989, & JP–A–10 32 66 Mitsubishi Feb. 2, 1989.

*Primary Examiner*—Minh-Loan Tran
*Attorney, Agent, or Firm*—Theodore E. Galanthay; Lisa K. Jorgenson; James H. Morris

[57] ABSTRACT

A protection structure and method are provided for protecting a first pad of an integrated circuit, the integrated circuit having a second pad to receive a first supply voltage. The protection structure includes a first region of a first conductivity type coupled to the first pad; a second region of a second conductivity type coupled to the second pad; a substrate of the second conductivity type contacting the first and second regions; and an epitaxial layer of the first conductivity type. The epitaxial layer has an epitaxial region that contacts the first and second regions. A first diode can be formed outside the substrate between the first and second pads through at least two of the first region, the second region, and the epitaxial region. The protection structure may include a first portion and a second portion, wherein each portion has a different voltage threshold. Accordingly, the first diode can be formed through the second portion, but not the first portion. Hence, the protection structure will not cause interference to a sensitive component adjacent the first portion.

30 Claims, 5 Drawing Sheets

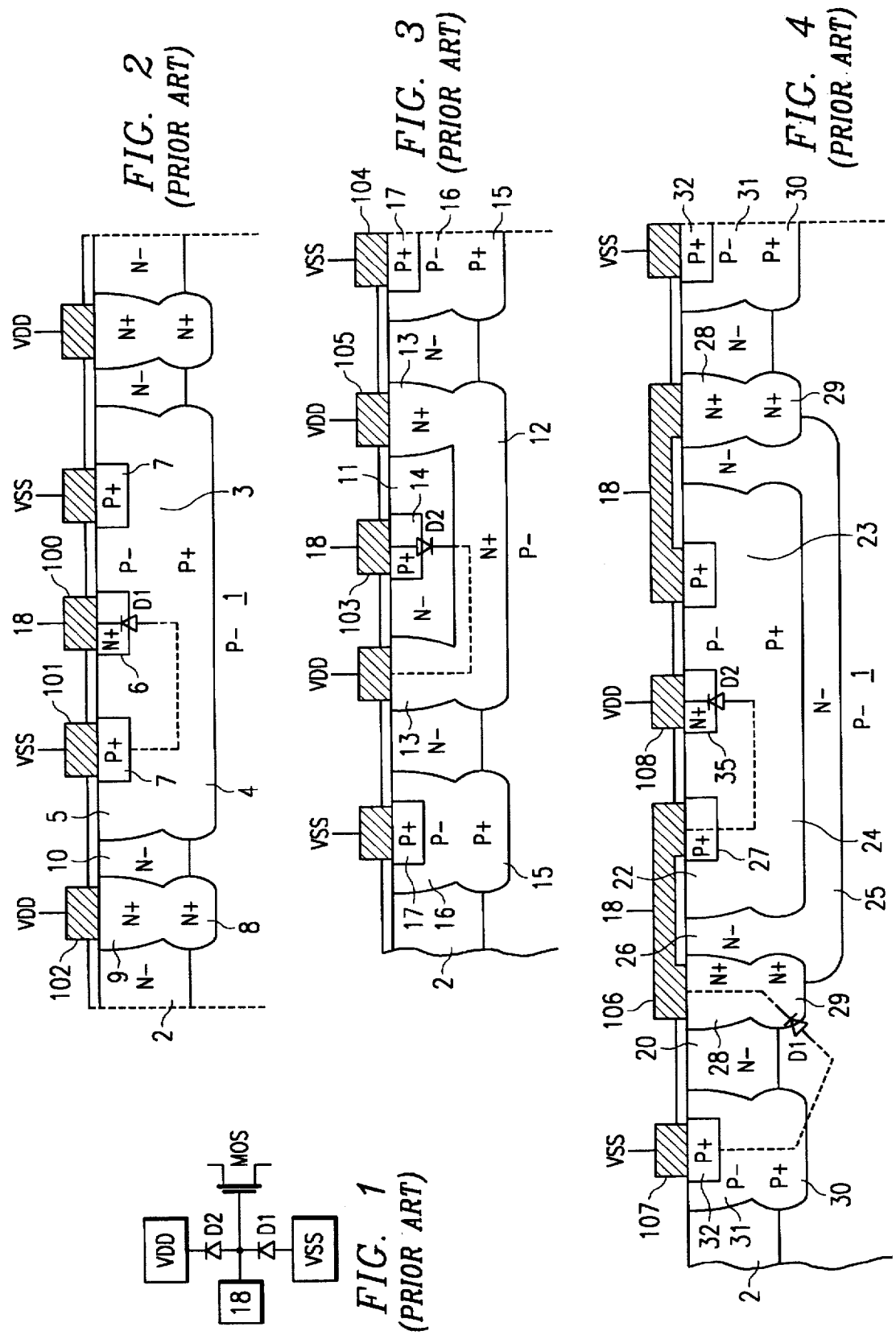

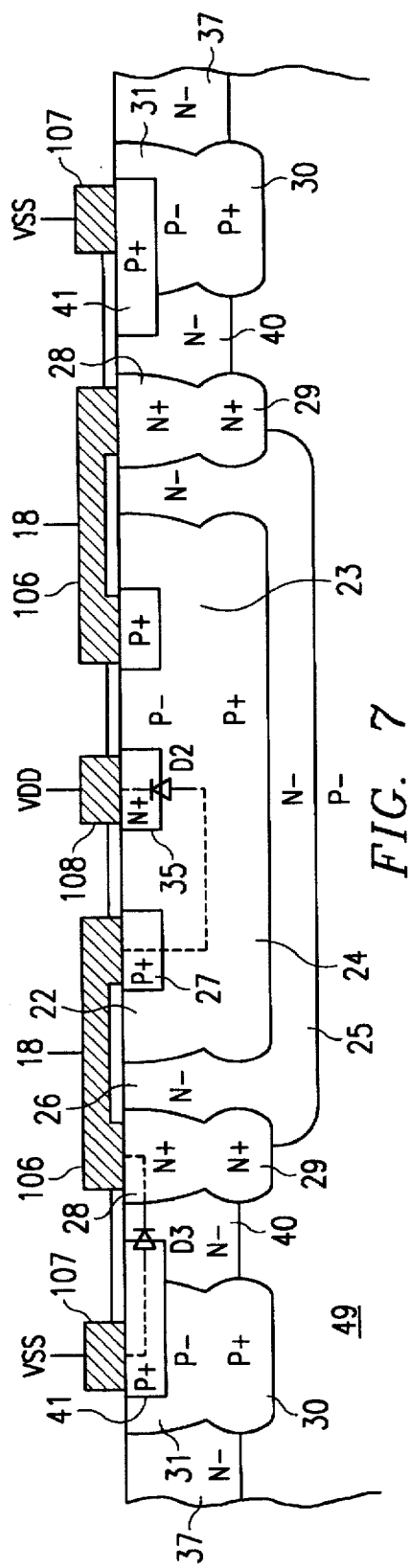
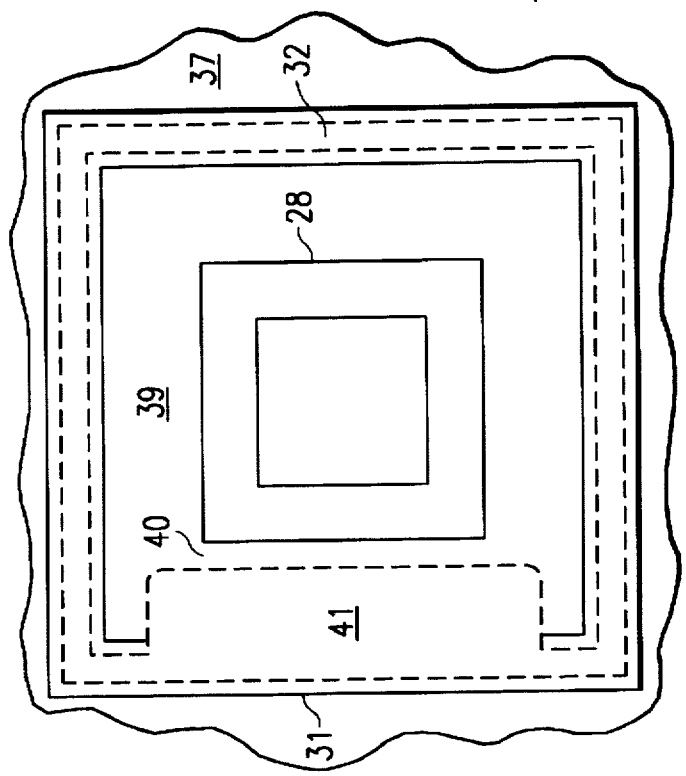
FIG. 7
FIG. 8

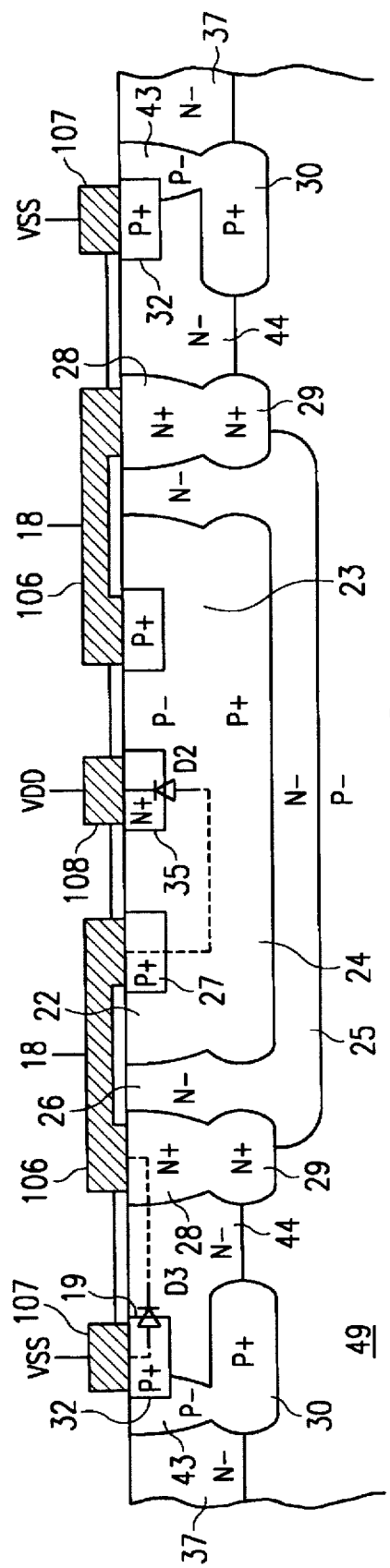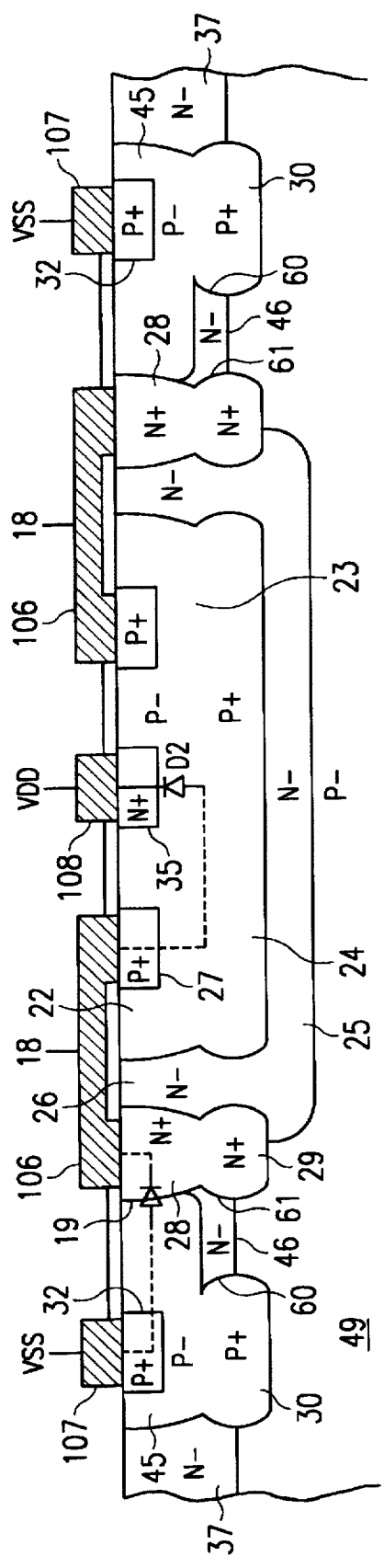

PAD PROTECTION DIODE STRUCTURE

BACKGROUND OF THE INVENTION

1. Field of the Invention

The present invention relates to the protection of integrated circuit pads against electrostatic discharges.

2. Discussion of the Related Art

Internal components of integrated circuits (ICs) are conventionally connected to integrated circuit pads, which are in turn connected to pins, so that the internal components can be electrically coupled to external circuits. Internal components of ICs are sensitive to electrostatic overvoltages (i.e., voltages which exceed the intended operating ranges of the ICs) occurring at the pins. In particular, an overvoltage may cause an internal component of an IC to operate erroneously. Furthermore, if sufficiently high, the overvoltage may damage the IC. To prevent erroneous operation and damage from overvoltages, ICs typically include electrostatic discharge protection circuits electrically coupled to their integrated circuit pads. A schematic example of such a protection circuit is shown in FIG. 1.

Pads may be connected to inputs or outputs of various types of integrated circuit components. FIG. 1 schematically shows an illustrative example of an IC including a MOS transistor having an integrated circuit pad 18 coupled to its input gate. The IC is coupled to power pads VDD and VSS, that are respectively coupled to a high supply voltage $V_{DD}$ and a low supply voltage $V_{SS}$ (e.g., ground) when power is applied to the IC. Pad 18 is coupled to both power pads VDD and VSS, through diodes D1 and D2, respectively. If pad 18 becomes more negative than the low supply voltage $V_{SS}$ (minus a voltage drop across diode D1), the overvoltage passes through diode D1 and is absorbed by the low supply voltage. If pad 18 becomes more positive than the high supply voltage $V_{DD}$ (plus a voltage drop across diode D2), the overvoltage passes through diode D2 and is absorbed by the high supply voltage. In both cases, the pad 18 and the internal IC component connected thereto (e.g., the MOS transistor shown in FIG. 1) are protected from the overvoltage.

Conventional ICs, including ICs having both bipolar and MOS components (BiMOS ICs), typically include a substrate of a one conductivity type (i.e., N-type or P-type) coated with an epitaxial layer of the other conductivity type. The internal IC components and the protection structures are formed within the substrate and the epitaxial layer. An example of such a conventional IC that includes a P-type substrate 1, an N-type epitaxial layer 2, and the protection structure of FIG. 1 is shown in FIGS. 2 and 3, which respectively illustrate conventional protection diode structures D1 and D2. The current flow paths through the diode structures are shown by dotted lines in the figures.

In the cross-sectional view of FIG. 2, diode D1 is shown as being formed in a P-type pocket 3 that includes a buried $P^+$-type layer 4 and a P-type diffusion layer 5 diffused above it. From the surface of pocket 3 are formed an $N^+$-type region 6 and an annular $P^+$-type region 7 that surrounds region 6. The annular region 7 contacts a metallization 101 that is connected to the low voltage pad VSS, and region 6 contacts a metallization 100 connected to the pad 18. Diode D1 is formed at the junction between P-type pocket 3 and N-type region 6, as shown in FIG. 2.

In the structure of FIG. 2, an $N^+$-type ring 8–9 is formed outside pocket 3 by an $N^+$-type buried layer 8 and an $N^+$-type deep diffusion layer 9. The upper surface of diffusion layer 9 contacts a metallization 102 that is connected to the high voltage pad VDD. The $N^+$-type ring 8–9 polarizes a portion 10 of the N-type epitaxial layer disposed between the ring and the P-type pocket 3, and constitutes the collector of an NPN transistor whose emitter-base junction corresponds to diode D1. Thus, ring 8–9 collects charges when diode D1 is conductive.

As shown in the cross-sectional view of FIG. 3, the diode D2 between the pad 18 and the high supply voltage $V_{DD}$ is formed through an $N^-$-type portion 11 of the epitaxial layer, an $N^+$-type buried layer 12 formed below the portion 11 of the epitaxial layer, and an $N^+$-type diffused ring 13 that contacts buried layer 12 and surrounds the portion 11 to insulate it from other regions of the IC. The upper surface of ring 13 contacts a metallization 105 connected to the high voltage pad VDD. A $P^+$-type region 14 is diffused in portion 11 of the epitaxial layer and contacts a metallization 103 connected to the pad 18. Thus, diode D2 is formed at the junction between $P^+$-type region 14 and the $N^-$-type portion 11 of the epitaxial layer.

The structure shown in FIG. 3 further includes a substrate polarization contact that includes a $P^+$-type buried layer 15, a $P^-$-type diffusion layer 16 disposed above it, and a $P^+$-type diffused region 17 that is disposed within the $P^-$-type diffusion layer 16 and contacts a metallization 104 connected to the low voltage pad VSS. The substrate polarization contact forms the collector of a PNP transistor whose emitter-base junction corresponds to diode D2. Thus, the contact collects charges when the diode D2 is conductive.

Although the implementations of diodes D1 and D2 are shown separately in FIGS. 2 and 3, it should be understood that they can be used together in one IC to protect a single pad, as shown in FIG. 1. Thus, metallizations 100 and 103 that are respectively coupled to diodes D1 and D2 are both connected to the pad 18. When used together, diode structures D1 and D2 are conventionally disposed adjacent each other within the IC, so that the above-described substrate contact 15–17 surrounds both diode structures D1 and D2 to isolate them from the other internal components of the IC. Thus, the effects of operation of the protection structure on neighboring components of the IC is reduced because the substrate contact prevents carriers from straying toward other adjacent components. However, although the substrate contact may prevent stray carriers from interfering with adjacent components, the substrate contact does not prevent heat from dissipating from the diode structures to adjacent components which can cause the adjacent components to operate erroneously.

When high supply voltage $V_{DD}$ and low supply voltage $V_{SS}$ are respectively applied to pads VDD and VSS, the structures shown in FIGS. 2 and 3 work in combination to prevent a voltage applied to pad 18 from substantially exceeding high supply voltage $V_{DD}$, or from substantially falling below low supply voltage $V_{SS}$. In particular, when the voltage applied to the pad 18 exceeds the high supply voltage $V_{SS}$ by the forward voltage drop of the diode D2, diode D2 activates (i.e., carriers flow across the PN junction formed by P-type pocket 3 and N-type region 6, see FIG. 2) to effectively short the pad to the high supply voltage $V_{DD}$, thereby limiting the positive voltage on the pad 18. Similarly, when the voltage applied to the pad 18 falls below the low supply voltage $V_{SS}$ by the forward voltage drop oft he diode D1, diode D1 activates (i.e., carriers flow across the PN junction formed by $P^+$-type region 14 and $N^-$-type portion 11 of the epitaxial layer, see FIG. 3) to effectively short the pad to the low supply voltage $V_{SS}$, thereby limiting the negative voltage on the pad 18. Accordingly, the pad 18 and the internal components coupled to pad 18 are protected from both positive and negative overvoltage conditions.

Another prior art diode protection structure is illustrated in FIG. 4. This structure also includes protection diodes D1 and D2 formed in a P⁻-type substrate 1 and N⁻-type epitaxial layer 2. The structure is symmetrical in cross-section, and is annular from a top view. The structure includes a P⁻-type pocket 23 formed from a P⁺-type buried layer 24 and a P⁻-type diffusion layer 22 diffused above it. In the pocket 23, an annular P⁺-type diffused region 27 and an N⁺-type diffused region 35 are formed at the surface of the P⁻-type diffusion layer 22, and respectively coupled to the pads 18 and VDD through metallizations 106 and 108.

Entirely surrounding the pocket 23 is an N⁻-type region that includes a portion 26 of the epitaxial layer and an N⁻-type buried layer 25 that separates the pocket 23 from the substrate 1. At the periphery of the N⁻-type region 25–26 is an N⁺-type annular ring formed by an N⁺-type buried layer 29, and an N⁺-type deep diffused region 28 that contacts both the N⁺-type buried layer 29 and the metallization 106 connected to the pad 18. Surrounding the N⁺-type annular ring 28–29 is an annular P-type substrate contacting well for polarizing the substrate, including a P⁺-type buried layer 30, a P⁻-type deep diffusion layer 3 I, and a P⁺-type contact region 32. The P-type substrate contacting well is connected to a low voltage pad VSS through a metallization 107.

As is schematically shown in FIG. 4, diode D1 is formed at the junction between P⁻-type substrate 1 and N⁺-type ring 28–29, and diode D2 is formed at the junction between P⁻-type diffusion layer 22 and N⁺-type region 35. The P-type substrate contacting well forms a portion of diode D1, and also isolates the protection structure from other components of the IC. In particular, the P-type substrate contacting well prevents carriers from straying from the protection structure toward other adjacent components.

The structure shown in FIG. 4 implements the protection circuit of FIG. 1, and operates in a similar manner as the structures of FIGS. 2 and 3. In particular, when power is connected to the protection structure, diodes D1 and D2 prevent the voltage applied to pad 18 from increasing substantially above high supply voltage $V_{DD}$ or decreasing substantially below low supply voltage $V_{SS}$ by activating to provide carrier flow across the PN junctions to adjust the voltage at pad 18 during an overvoltage condition.

The doping concentration of the substrate 1 is typically higher than the doping concentration of the epitaxial layer 2. Accordingly, when diode D1 is activated, conduction (i.e., current flow) occurs between P⁻-type substrate 1 and N⁺-type region 29, rather than between P⁺-type region 30–31 and the N⁻-type portion 20 of the epitaxial layer 2. In particular, carrier flow occurs from P⁺-type region 30 to N⁺-type region 29 through the portion of the substrate 1 that is disposed therebetween.

It should be understood that in the structures described above, the conductivity types of the semiconductor materials and the applied polarities may be reversed from those shown in the figures, and may be formed using conventional bipolar and MOS manufacturing techniques. The buried layers and the diffusion layers are formed during separate manufacturing steps. In particular, the buried layers are typically formed on the substrate before the formation of the epitaxial layer. After the epitaxial layer is formed over the substrate, the various diffusion layers and regions are formed within it. The various regions and rings discussed above as being annular may alternatively be rectangular.

The protection structure of FIG. 4 has been found to work successfully. However, due to its arrangement, this structure may be susceptible to experiencing a latch-up condition, leading lead to erroneous operation of the structure, and damage to internal components of the IC and external devices connected thereto.

A latch-up condition occurs when carriers flow end to end through an entire PNPN or NPNP structure in a device in an unintended manner. Typically, separate portions of the PNPN or NPNP structure are intended to operate individually as single transistors or diodes, i.e., the portions are not intended to operate together to provide a single current path from one end to the other end. However, if carriers accumulate within critical areas of the PNPN or NPNP structure, conduction may occur across each PN junction resulting in undesired carrier flow through the entire structure.

For example, FIG. 5 shows the protection device of FIG. 4, without the schematic representation of diodes D1 and D2. This protection device includes a vertically-oriented PNPN structure, i.e., P⁻-type substrate 1, N-type region 25, P⁻-type pocket 23, and N⁺-type region 35. As discussed above, conduction is intended to occur separately between P⁻-type substrate 1 and N⁺-type region 29 (diode D1), and between P⁻-type pocket 23 and N⁺-type region 35 (diode D2). No conduction is intended to occur between either the P⁻-type substrate 1 and the N⁻-type region 25, or the P-type pocket 23 and the N⁻-type region 25. However, carriers may build up in the P⁻-type substrate 1, since lowly doped regions have a tendency to accumulate carriers. If the accumulation is substantial, carriers may flow from the P⁻-type substrate 1, across the N⁻-type region 25, into P-type pocket 23, thereby causing a latch-up condition wherein carriers flow across each PN junction of the PNPN structure. When the latch-up condition occurs, the low voltage pad VSS is electrically connected to the high voltage pad VDD as indicated schematically by the dotted line in FIG. 5. This shorting of the low and high voltage pads could damage the IC, as well as the external power source which provides voltages $V_{DD}$ and $V_{SS}$.

In addition, other integrated components of the IC located next to the protection structure of FIG. 4 may be susceptible to the operation of the protection structure. In particular, heat generated upon activation of one of the protection diodes may cause a sensitive or critical component positioned nearby to operate erroneously.

An object of the present invention is to provide an improved pad protection diode structure and a method for its formation.

SUMMARY OF THE INVENTION

One embodiment of the invention is directed to a protection structure for protecting a first pad of an integrated circuit, wherein the integrated circuit has a second pad to receive a first supply voltage. The protection structure includes a first region of a first conductivity type coupled to the first pad; a second region of a second conductivity type coupled to the second pad; a substrate of the second conductivity type contacting the first and second regions; and an epitaxial layer of the first conductivity type. The epitaxial layer has an epitaxial region that contacts the first and second regions. A first diode is formed outside the substrate between the first and second pads through at least two of the first region, the second region, and the epitaxial region.

Another embodiment of the invention is directed to an integrated circuit including a first power pad; a second power pad; a third pad that receives a signal; and a protection structure that protects the third pad. The protection structure includes a diode between the second power pad and the third pad, and preventing means for preventing carrier flow from the diode from causing a latch-up condition between the first power pad and the second power pad.

Another embodiment of the invention is directed to a method for protecting a first pad of an integrated circuit, the first pad being adapted to receive a signal. The integrated circuit includes a second power pad to receive a first supply reference, and a third power pad to receive a second supply reference. The method includes the step of forming a diode in the integrated circuit between the first pad and the second power pad. The diode is disposed so that when the diode is activated, carrier flow from the diode cannot cause a latch-up condition between the second power pad and the third power pad.

Another embodiment of the invention is directed to an integrated circuit including a first pad to receive a signal; a second power pad to receive a supply reference; a component; and a protection structure, coupled between the first pad and the second power pad, that protects the first pad. The protection structure includes a first portion adjacent the component and a second portion. The first portion has a first conduction junction with a first voltage threshold. The second portion has a second conduction junction with a second voltage threshold. The first and the second voltage thresholds are different.

Another embodiment of the invention is directed to a protection structure for protecting a first pad of an integrated circuit, the integrated circuit having a second pad to receive a first supply voltage. The protection structure includes a first region of a first conductivity type coupled to the first pad; a second region of a second conductivity type having a first highly doped area coupled to the second pad and a lowly doped area; and a substrate of the first conductivity type contacting the first and second regions. The lowly doped area of the second region is disposed between the first highly doped area of the second region and the substrate. A diode is formed outside the substrate between the first and second regions.

The foregoing and other objects, features, and advantages of the present invention will be more readily understood and apparent from the following detailed description of the invention, which should be read in conjunction with the accompanying drawings.

BRIEF DESCRIPTION OF THE DRAWING

FIG. 1 is a schematic diagram of an electrostatic discharge protection circuit that includes protection diodes D1 and D2;

FIG. 2 is a cross-sectional view of a prior art implementation of the protection diode D1;

FIG. 3 is a cross-sectional view of a prior art implementation of the protection diode D2;

FIG. 4 is a cross-sectional view of another prior art implementation of a protection circuit of FIG. 1, including both protection diodes D1 and D2;

FIG. 7 is a cross-sectional view of an alternate embodiment of the protection structure of the present invention, wherein one of the protection diodes is formed at a junction between the epitaxial layer and an extended $P^+$-type region coupled to the supply voltage terminal;

FIG. 8 is a top view of the embodiment of in FIG. 7;

FIG. 9 is a cross-sectional view of another alternate embodiment of the protection structure of the present invention, wherein one of the protection diodes is formed at a junction between the epitaxial layer and a $P^+$-type region coupled to the supply voltage terminal;

FIG. 10 is a cross-sectional view of another alternate embodiment of the protection structure of the present invention, wherein one of the protection diodes is formed at a junction between an extended $P^-$-type region and an $N^+$-type region coupled to the pad;

DETAILED DESCRIPTION

The present invention is directed to improved pad protection diode structures. It should be understood that the figures used to illustrate the embodiments of the present invention discussed below, as well as those relating to the prior art structures discussed above, are not drawn to scale. Additionally, the edges of some layers are shown with right angles for the sake of simplification. However, it should be understood that the manufacturing steps (e.g., diffusion or ion implantation) used to manufacture such structures typically result in the formation of rounded edges.

Illustrative embodiments of the pad protection diode structure according to the present invention are shown in FIGS. 6–12. Elements of these embodiments that are similar to elements shown in FIGS. 1 and 4 are labeled with the same reference numbers.

The present invention is directed to protection structures that protect pads against electrostatic discharges. In particular, embodiments of the present invention provide diodes that protect pads against electrostatic overvoltages. These embodiments are similar to the protection structure cross-sectionally shown in FIG. 4 and schematically shown in FIG. 1. For example, each of the embodiments of the present invention is directed to a protection structure that includes a substrate and an epitaxial layer with regions formed therein. Each of the embodiments of the present invention may optionally provide a diode D2, which is implemented in a similar manner to the diode D2 of the conventional protection structure shown in FIG. 4 and performs the same function. However, in contrast to the protection structure of FIG. 4 which provides diode D1 through substrate 1, each of the protection structures of the present invention provides a protection diode D3 which is formed through regions other than the substrate.

Figure 5:
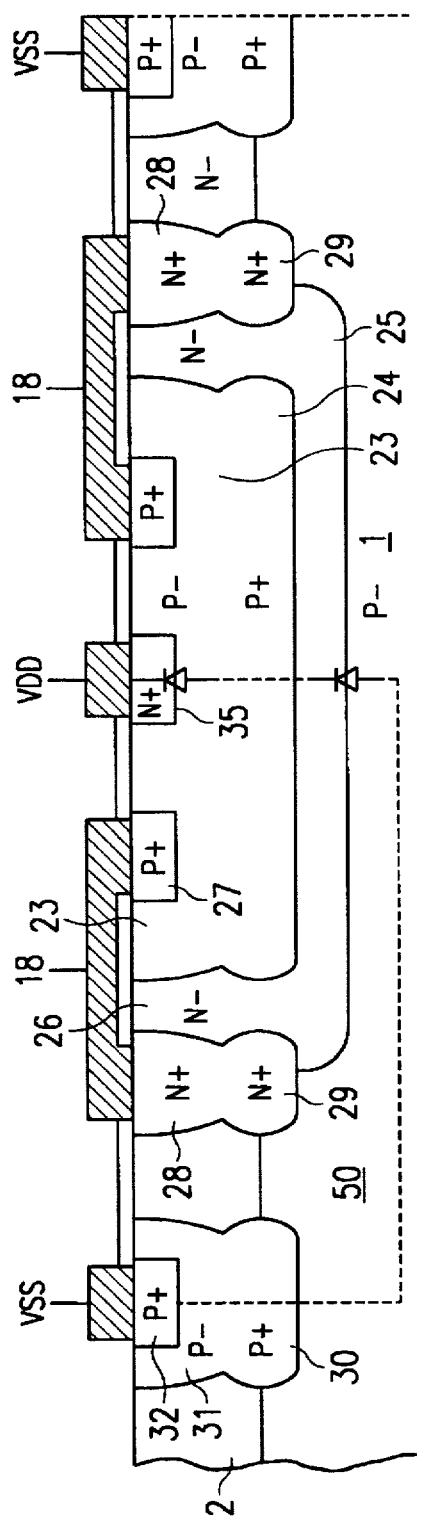
FIG. 5 is a cross-sectional view of the prior art assembly of FIG. 4 showing carrier flow when a latch-up condition occurs.
Figure 6:
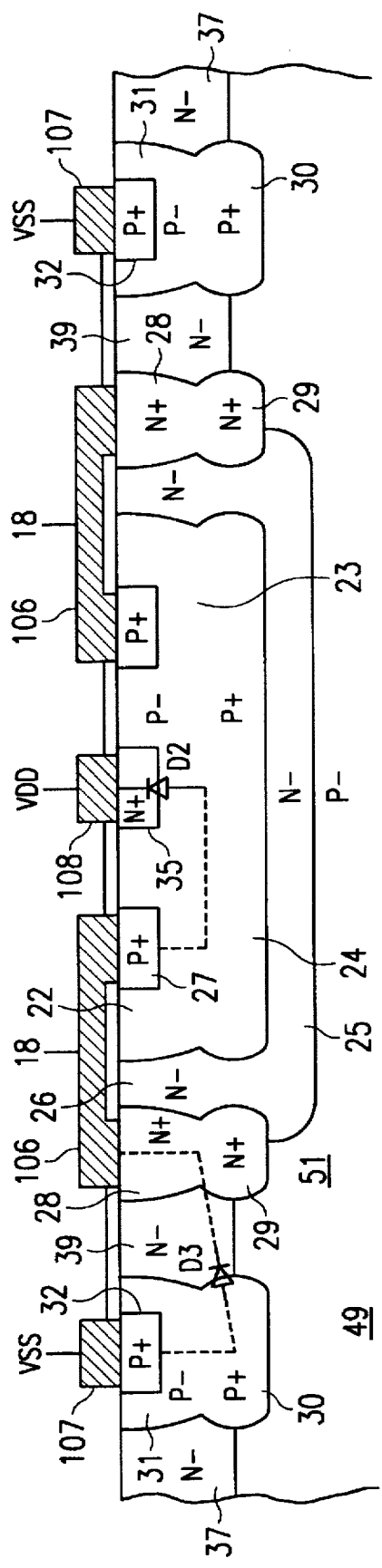
FIG. 6 is a cross-sectional view of an embodiment of the protection structure of the present invention including a pair of protection diodes, wherein one of the protection diodes is formed through the epitaxial layer of the structure.

In one embodiment of the invention shown in FIG. 6, the protection structure includes diode D3 formed through a portion 39 of the epitaxial layer. The protection structure is arranged to protect pad 18 against overvoltages, and includes diodes D2 and D3 that are formed in an integrated circuit having a $P^-$-type substrate 49 and an $N^-$-type epitaxial layer 37. Diode D2 functions in the manner described above in connection with FIG. 4, such that conduction occurs at the junction between P-type pocket 23 and $N^+$-type region 35. However, diode D3 operates differently from diode D1 to protect the pad 18 from becoming negatively overcharged by enabling carrier flow from the power pad VSS to the pad 18 when the voltage therebetween exceeds the voltage drop across diode D3.

According to the embodiment of FIG. 6, the power pad VSS is coupled to a substrate polarization contact (i.e., P-type region 30–32). He pad 18 is coupled to N$^+$-type region 28–29, and a portion 39 of the epitaxial layer is disposed therebetween. When diode D3 is turned on, conduction occurs between P-type region 30–31 and the N$^-$-type portion 39 of the epitaxial layer 37. Conduction occurs here, rather than between P$^-$-type substrate 49 and N$^+$-type region 29, because the doping concentration of the portion 39 of the epitaxial layer is higher than the doping concentration of the P$^-$-type substrate 49. Thus, the relatively higher concentration of impurities in the portion 39 of the epitaxial layer results in greater electrical conductivity, so that the diode D3 is formed through the epitaxial layer rather than the substrate 49. Accordingly, in contrast to the structure of FIG. 4, when diode D3 turns on, carrier flow from P-type region 30–31 to N$^+$-type region 28–29 passes through the N$^-$-type portion 39 of the epitaxial layer disposed therebetween.

The embodiment of FIG. 6 is less susceptible to latch-up (i.e., carrier flow from pad VSS to pad VDD) than the prior art structure of FIG. 4 for a number of reasons. First, carrier accumulation in the P$^-$-type substrate 49 is unlikely, since carrier flow occurs through the N$^-$-type portion 39 of epitaxial layer rather than through the substrate. Second, any carrier accumulation in the N$^-$-type portion 39 of the epitaxial layer is readily absorbed by the N$^+$-type region 28–29, since highly doped regions absorb carriers more quickly than lowly doped regions. In particular, if carriers stray away from the N$^-$-type portion 39 of the epitaxial layer, they are likely to be absorbed by the N$^+$-type region 28–29 before reaching P-type pocket 23 due to the proximity of the N$^+$-type region 28–29 to the conducting region, and the positioning of the N$^+$-type region 28–29 between the portion 39 of the epitaxial layer and pocket 23. Accordingly, the embodiment of FIG. 6 is less susceptible to latch-up.

Conventional manufacturing techniques can be used to ensure that the conducting region of diode D3 occurs at the junction of P-type region 30–32 and the portion 39 of the N-type epitaxial layer. The buried and diffusion layers can be formed in the same manner as those in the protection structure of FIG. 4. However, the doping concentrations are controlled so that the doping concentration of the portion 39 of the epitaxial layer is higher than that of the substrate 49. This can be done in a number of ways. In one embodiment of the invention, the doping concentration of the portion 39 of the epitaxial layer 37 is twice that of the substrate 49.

In accordance with one method of formation according to the present invention, the doping concentrations of substrate 49 and epitaxial layer 37 are initially set to conventional levels, such as those used in the conventional structure of FIG. 4. The doping concentration of the portion 39 of the epitaxial layer is then increased separately (e.g., by diffusion) so that only the doping concentration of the portion 39 of the epitaxial layer between P-type region 30–32 and N$^+$-type region 28–29 is higher than that of the substrate 49. In one embodiment of the invention, the doping concentrations of the portion 39 of the epitaxial layer and the substrate 49 are approximately in the ranges of $2 \times 10^{14}$/cm$^3$–$2 \times 10^{16}$/cm$^3$ and $1 \times 10^{14}$/cm$^3$–$1 \times 10^{16}$/cm$^3$, respectively.

Alternatively, the doping concentration of the entire epitaxial layer 37, including portion 39, can be set to a constant level that is higher than that of the substrate 49. In one embodiment of the invention, the doping concentrations of the entire epitaxial layer 37 and the substrate 49 are approximately in the ranges of $5 \times 10^{13}$/cm$^3$–$5 \times 10^{15}$/cm$^3$ and $2 \times 10^{13}$/cm$^3$–$2 \times 10^{15}$/cm$^3$, respectively. In another embodiment, the doping concentrations of the entire epitaxial layer 37 and the substrate 49 are approximately in the ranges of $2 \times 10^{14}$/cm$^3$–$2 \times 10^{16}$/cm$^3$ and $1 \times 10^{14}$/cm$^3$–$1 \times 10^{16}$/cm$^3$, respectively.

If the protection structure of FIG. 6 is formed using a conventional doping concentration level for the substrate and a higher level for the epitaxial layer, the epitaxial layer has lower resistivity (i.e., lower ohm-cm characteristics) than in conventional structures. Lowering the resistivity enables better control over certain electrical characteristics of the integrated device. In particular, lowering resistivity of the epitaxial layer improves precision and consistency of the conduction characteristics of diode D3.

As stated above, the embodiment of FIG. 6 operates in a manner similar to that of the conventional structure shown of FIG. 4 in protecting pad 18. However, unlike in the structure of FIG. 4, carrier flow in the embodiment of FIG. 6 occurs through the epitaxial layer when diode D3 is activated, thereby reducing the likelihood of a latch-up condition occurring.

Although the diode D3 is shown in FIG. 6 as forming part of a protection structure that also includes diode D2, it should be understood that the invention is not limited to this arrangement, and that diode D3 can alternatively be provided alone (i.e, without another diode such as D2), or in combination with a different diode structure to protect pad 18. Furthermore, although the protection structure shown in FIG. 6 is symmetrical, it should be understood that other arrangements are possible, and that the structure may have a conventional annular or rectangular shape, or have some other shape when viewed from above.

In another embodiment of the present invention, the protection structure is constructed and arranged so that it can be disposed adjacent a sensitive component without causing interference when carrier flow occurs through the protection structure. According to this embodiment, the protection structure has a first portion with a cross-sectional profile that is similar to the embodiment of FIG. 6, and a second portion similar to the structure shown in FIG. 7. In particular, the protection structure is rectangular, and has a top view as illustrated in FIG. 8. Three sides of the protection structure have a cross-sectional profile similar to FIG. 6, and form a first portion of the protection structure having a first conducting voltage. The other side has a cross-sectional profile as shown in FIG. 7, and forms the second portion having a second conducting voltage. Accordingly, when the particular positive overvoltage value is applied to pad 18, carrier flow occurs through the second portion to protect pad 18, but not through the first portion.

In the embodiment of FIGS. 7–8, the power pad VSS is connected, through metallization 107, on three sides of the rectangular protection structure to the P$^+$-type region 32 (FIG. 6) that forms part of the substrate polarization contact 30–32, and on the other side to an extended P$^+$-type region 41 that extends through P$^-$-type region 31 toward pad 18. Diode D3 is formed between power pad VSS and pad 18 through extended P$^+$-type region 41, N$^+$-type region 28, and a portion 40 of the epitaxial layer disposed therebetween.

In the embodiment of FIGS. 7–8, the portion 40 of the epitaxial layer has a higher doping concentration than substrate 49. As a result, conduction occurs between the extended $P^+$-type region 41 and the portion 40 of the epitaxial layer, rather than between the $P^-$-type substrate 49 and $N^+$-type region 28–29. Moreover, carrier flow passes through the portion 40 of the epitaxial layer and not through the substrate 49, thereby reducing the likelihood of latch-up.

In one embodiment of the invention, the doping concentrations of portion 40 of the epitaxial layer and the $P^-$-type substrate 49 are approximately in the ranges of $5 \times 10^{13}/cm^3 - 5 \times 10^{15}/cm^3$ and $2 \times 10^{13}/cm^3 - 2 \times 10^{15}/cm^3$, respectively. In another embodiment, the doping concentrations of portion 40 of the epitaxial layer and the $P^-$-type substrate 49 are approximately in the ranges of $2 \times 10^{14}/cm^3 - 2 \times 10^{16}/cm^3$ and $1 \times 10^{14}/cm^3 - 1 \times 10^{16}/cm^3$, respectively.

The embodiment of FIGS. 7–8 enables diode D3 to be precisely located so as to minimize the impact of the protection structure on the remaining components of the IC. In particular, since the lower required conduction voltage is lowest between the extended $P^+$-type region 41 and portion 40 of the epitaxial layer 37, conduction occurs only between the extended $P^+$-type region 41 and the portion 40 of the epitaxial layer between it and the $N^+$-type region 28–29, i.e., conduction does not occur on the other sides of the protection structure. Accordingly, when the protection structure is disposed adjacent a critical or sensitive component 65 in the IC, placement of the extended $P^+$-type region 41 on the side of the protection structure furthest away from the component minimizes the protection structure's influence on the component. Specifically, carrier flow and heat build up in the diode D3 are not located adjacent the sensitive component, thereby reducing the likelihood that activation of diode D3 will either cause the component to operate erroneously or damage it.

Although the extended $P^+$-type region 41 is shown as extending toward pad 18 on only one side of the protection structure in FIG. 8, it should be understood that the extended region 41 can alternatively extend toward pad 18 on more than one side of the structure. For example, the extended $P^+$-type region 41 may be formed on three sides, with $P^+$-type region 32 through which conduction does not occur being formed on only the side closest the critical or sensitive component. It should be further understood that the protection structure is not limited to conventional rectangular or annular shapes, and that other shapes are possible.

As stated above, the extended $P^+$-type region 41 may advantageously be disposed within the structure at locations furthest away from critical or sensitive areas of the integrated device. The placement of diode D3 within the protection structure is controlled by shaping the masks used during fabrication to provide the various layers and regions in the desired locations within the structure. After the masks are arranged to provide the desired shapes, they are used in a conventional manner to fabricate the various layers and regions of the protection structure of the present invention.

It should be appreciated that according to the embodiment of FIGS. 7–8, the protection structure includes a first portion and a second portion, each portion having a different cross-sectional profile. The first and second portions have different voltage thresholds so that diode D3 is formed only in the second portion of the protection structure. The first and second voltage thresholds are set so that when a voltage having a value between the first and second voltage thresholds is applied to the pad 18, carrier flow occurs between pads 18 and VSS, through the second portion but not the first portion.

In another embodiment of the present invention shown in FIG. 9, the protection structure includes a cross-sectional profile that is similar in many respects to the embodiment of FIG. 6 in that diode D3 includes a substrate polarization contact, an $N^+$-type region 28–29, and a portion of the epitaxial layer disposed therebetween. However, the substrate polarization contact includes a narrow $P^-$-type region 43 disposed between $P^+$-type region 32 and $P^+$-type region 30. As a result, $P^+$-type region 32 contacts a portion 44 of the $N^+$-type epitaxial layer. The doping concentration of the portion 44 of the epitaxial layer is higher than that of the substrate 49. Accordingly, conduction occurs at a junction 19 formed between the $P^+$-type region 32 and the portion 44 of the epitaxial layer, rather than between the substrate 49 and $N^+$-type region 29, as shown schematically in FIG. 9. Hence, carrier flow through the substrate 49 is avoided and the likelihood of a latch-up condition occurring is reduced.

In one embodiment of the invention, the doping concentrations of portion 44 of the epitaxial layer and the $P^-$-type substrate 49 are approximately in the ranges of $5 \times 10^{13}/cm^3 - 5 \times 10^{15}/cm^3$ and $2 \times 10^{13}/cm^3 - 2 \times 10^{15}/cm^3$, respectively. In another embodiment, the doping concentrations of portion 44 of the epitaxial layer and the $P^-$-type substrate 49 are approximately in the ranges of $2 \times 10^{14}/cm^3 - 2 \times 10^{16}/cm^3$ and $1 \times 10^{14}/cm^3 - 1 \times 10^{16}/cm^3$, respectively. The doping concentrations of the substrate 49 and the portion 44 of the epitaxial layer can be set using any of the techniques discussed above in connection with the embodiment of FIG. 6.

According to the embodiment of FIG. 9, the diode protection structure may include a portion having a cross-sectional profile as illustrated in FIG. 9 and a cross-sectional profile as illustrated in FIG. 6. Carrier flow occurs within the portion having the cross-sectional profile as illustrated in FIG. 9, since the voltage required for conduction to occur is lower in this portion. As with the embodiments of FIGS. 7–8, the arrangement of the portions can be customized so that diode D3 is located within the protection structure away from any critical or sensitive IC components, to lessen the affects of carrier flow and heat build up during activation of diode D3.

As with the embodiment of FIG. 6, the substrate contact of the embodiment of FIG. 9 prevents carriers from straying from the protection structure toward other adjacent components. $P^+$-type region 30 of the substrate contact of the embodiment of FIG. 9 is disposed between the conduction junction 19 and the substrate 49. As a result, $P^+$-type region 30 absorbs any stray carriers that accumulate in the portion 44 of the epitaxial layer before they can reach the substrate 49.

Figure 11:
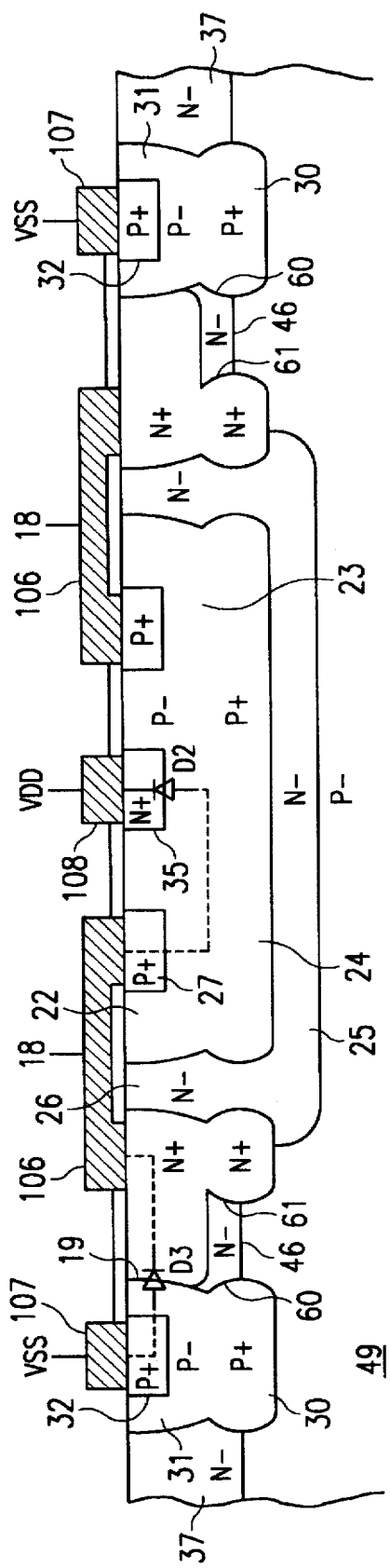
FIG. 11 is a cross-sectional view of another alternate embodiment of the protection structure of the present invention, wherein one of the protection diodes is formed at a junction between an $P^-$-type region and an extended $N^+$-type region coupled to the pad.

In another embodiment of the present invention shown in FIGS. 10 and 11, the P-type and N-type regions that are respectively coupled to the power pad VSS and the pad 18 are arranged so that they contact each other directly to form a conduction junction 19 that is separated from the substrate 49 by a section 46 of the epitaxial layer. Susceptibility to latch-up is reduced since carrier flow is not through the substrate 49, and since carriers are less likely to accumulate in the substrate because section 46 separates the conduction junction 19 and the substrate 49.

The section 46 of the epitaxial layer has an outer edge 60 and an inner edge 61, and the conduction junction 19 may be positioned anywhere along the section 46 between edges 60 and 61. In the particular arrangement shown in FIG. 10, the conduction junction 19 is disposed adjacent the inner edge 61 of section 46 of the epitaxial layer. $P^-$-type region 45 and $N^+$-type region 28 are respectively coupled to the power pad VSS and the pad 18 and contact each other to form the conduction junction 19 of diode D3. In one embodiment of the invention, the doping concentrations of the contacting P⁻-type region 45 and N⁺-type region 28 are approximately in the ranges of $5 \times 10^{17}/\text{cm}^3 - 5 \times 10^{19}/\text{cm}^3$ and $1 \times 10^{18}/\text{cm}^3 - 1 \times 10^{20}/\text{cm}^3$, respectively, with the doping concentrations of each of the portion 46 of the epitaxial layer and the substrate 49 being approximately less than $5 \times 10^{17}/\text{cm}^3$.

In the arrangement shown in FIG. 11, the conduction junction 19 is disposed adjacent the outer edge 60 of section 46. P⁻-type region 31 and N⁺-type region 47 are respectively coupled to the power pad VSS and the pad 18 and contact each other to form the conduction junction 19 of diode D3. In one embodiment of the invention, the doping concentrations of the contacting P⁻-type region 31 and N⁺-type region 47 are approximately in the ranges of $5 \times 10^{17}/\text{cm}^3 - 5 \times 10^{19}/\text{cm}^3$ and $1 \times 10^{18}/\text{cm}^3 - 1 \times 10^{20}/\text{cm}^3$, respectively, with the doping concentrations of each of the portion 46 of the epitaxial layer and the substrate 49 being approximately less than $5 \times 10^{17}/\text{cm}^3$. Although the conduction junction 19 is shown at the edges of the portion 46 of the epitaxial layer, it should be understood that the conduction junction can be formed anywhere between these edges.

In another embodiment of the invention, the protection structure includes a portion having a cross-sectional profile similar to the embodiment FIG. 6, and another portion having a cross-sectional profile similar to the embodiment of FIGS. 10 and 11. Diode D3 is formed only in the portion having the cross-sectional profile of FIGS. 10 and 11 since this portion has the lower conduction voltage. Thus, diode D3 can be optionally located within the protection structure away from any critical or sensitive IC components to lessen the affects of carrier flow and heat build up during activation of diode D3, as described above in connection with the embodiments of FIGS. 7-9.

Figure 12:
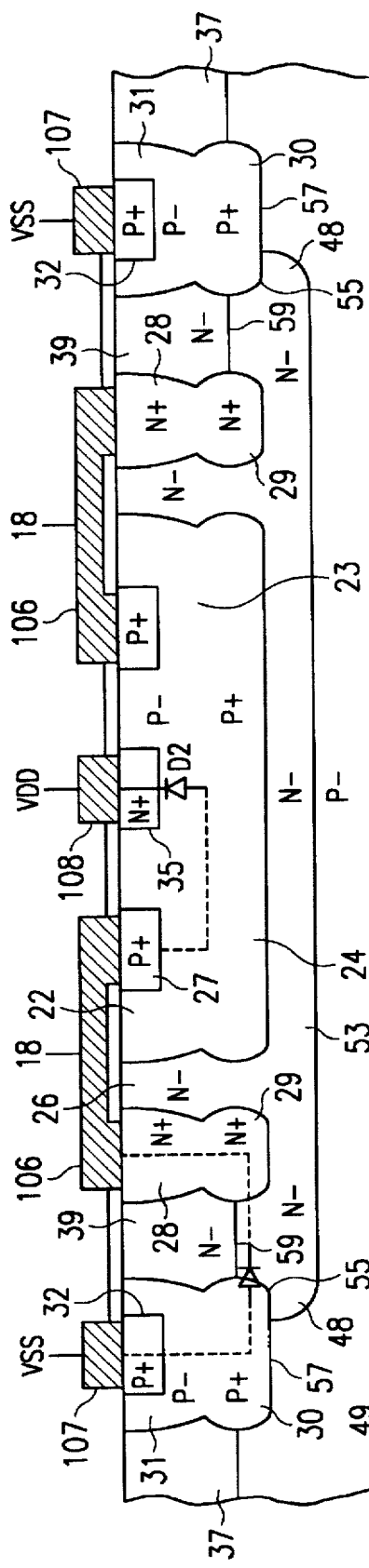
FIG. 12 is a cross-sectional view of another alternate embodiment of the protection structure of the present invention, wherein one of the protection diodes is formed at a junction between a $P^+$-type region and an extended $N^-$-type region including the epitaxial layer and an $N^-$-type buried layer.

In another embodiment of the present invention shown in FIG. 12, a lowly doped N⁻-type buried layer 53 is provided beneath the P-type pocket 23 similar to the N⁻-type layer 25 in the conventional structure of FIG. 4. However, the N⁻-type buried layer 53 includes a portion 48 that extends further to completely underlie the N⁺-type region 29 and a portion 39 of the epitaxial layer between N⁺-type region 28-29 and P-type region 30-32. Portion 48 of the N⁻-type buried layer 53 further underlies at least a portion of P-type region 30-32 contacting region 30-32 along both an inner edge 55 and a bottom surface 57.

The doping concentrations of the portion 48 of the N⁻-type buried layer 53 and the portion 39 of the epitaxial layer are set higher than the doping concentration of substrate 49, using any of the techniques discussed above in connection with FIG. 6. Accordingly, carrier flow occurs within the portion 39 of the epitaxial layer and the portion 48 of the N⁻-type buried layer 53, rather than through the substrate 49. As shown in FIG. 12, carrier flow particularly occurs in the portion 48 of the N⁻-type buried layer 53 just below a boundary 59 between the portion 39 of the epitaxial layer and the portion 48 of the N⁻-type buried layer 53. Carrier flow occurs along the boundary 59 because the doping concentration is highest there. In particular, after the N⁻-type buried layer 53 is created within the substrate, formation of the portion 39 of the N⁻-type epitaxial layer over the buried layer slightly increases the doping concentration of the N⁻-type buried layer 53 just below the boundary 59. Accordingly, this area provides the least resistive path for carrier flow. Because carrier flow occurs along boundary 59, carrier flow into the substrate 49 is prevented, thereby reducing the likelihood of latch up.

In contrast to the earlier described embodiments which are formed by adapting a mask used to form the diffusion layers, the embodiment of FIG. 12 is formed by adapting a mask used to form the buried layers within the substrate 49. Thus, the diode D3 is more deeply formed within the structure in the embodiment of FIG. 12.

It is well known to those skilled in the art that power dissipation at or near the surface of a device or IC can adversely affect the surface characteristics of the device or IC. In particular, excessive heat may change the electrical properties and/or the physical characteristics of the device or IC near its surface. Conversely, the same power dissipation occurring relatively far from the surface is less likely to adversely affect these surface characteristics. Accordingly, the embodiment of FIG. 12 may be advantageous for circuits that undergo large overvoltage conditions since diode D3 is provided deeply within the structure.

In each of the above-described embodiments, diode D3 is formed between pads 18 and VSS outside the substrate, i.e., diode D3 is formed in regions other than the substrate. In particular, in the embodiments of FIGS. 6, 7 and 9, carrier flow occurs between the P-type region coupled to pad 18 and the N-type region coupled to pad VSS through a portion of the epitaxial layer disposed therebetween. Alternatively, in the embodiments of FIGS. 10 and 11, the P-type and N-type regions directly contact each other so that carrier flow occurs directly from the P-type region to the N-type region. In the embodiment of FIG. 12, a boundary is formed between the portion 39 of the epitaxial layer and the N-type buried layer 48 to form a conducting path between the P-type region and the N-type region. Accordingly, in each of the above-described embodiments, carrier flow from the diode D3 when activated, is substantially inhibited from passing through the substrate. Rather, carrier flow is directed away from the substrate and passes through other regions. As a result, carrier flow from diode D3 is prevented from causing a latch-up condition between pads 18 and VDD.

An IC that incorporates any of the embodiments of the present invention may include a heat sink. Alternatively, the IC can be constructed and arranged so that its surface geometry includes sufficient surface area to prevent overheating of the integrated device which is advantageous because some heat sink mechanisms do not dissipate heat quickly enough to avoid damaging the structures when the protection structures are activated.

It should be understood that the specific selection of conductivity types made above is provided for the sake of illustration only, and that the conductivity types and the applied voltage polarities can be reversed in each of the embodiments of the invention. Moreover, although the protection structure is described above as being part of specific technologies (e.g., bipolar, MOS and BiMOS), the invention can be applied to other semiconductor technologies as well.

Having thus described several particular embodiments of the invention, various alterations, modifications, and improvements will readily occur to those skilled in the art. Such alterations, modifications, and improvements as are made obvious by this disclosure are intended to be part of this disclosure though not expressly stated herein, and are intended to be within the spirit and scope of the invention. Accordingly, the foregoing description is by way of example only and is not intended to be limiting. The invention is limited only as defined in the following claims and equivalents thereto.

What is claimed is:

1. A protection structure for protecting a first pad of an integrated circuit, the integrated circuit having a second pad to receive a first supply voltage, the protection structure comprising:

a first region of a first conductivity type coupled to the first pad;

a second region of a second conductivity type coupled to the second pad;

a substrate of the second conductivity type contacting the first and second regions; and an epitaxial layer of the first conductivity type, the epitaxial layer having a contiguous epitaxial region that contacts the first and second regions, wherein a first diode is formed outside the substrate between the first and second pads through at least two of the first region, the second region, and the epitaxial region.

2. The protection structure of claim 1, wherein the epitaxial region is disposed between the first and second regions, wherein the substrate has a first doping concentration, and wherein the epitaxial region has a second doping concentration that is higher than the first doping concentration so that the first diode is formed through the epitaxial region.

3. The protection structure of claim 2, wherein the epitaxial region further contacts the substrate.

4. The protection structure of claim 3, wherein the second region includes a first highly doped area coupled to the second pad, and a lowly doped area disposed between the first highly doped area and the substrate.

5. The protection structure of claim 4, wherein the second region further includes a second highly doped area disposed between the lowly doped area and the substrate, and wherein the second highly doped area contacts the epitaxial region to form a conduction junction of the first diode.

6. The protection structure of claim 4, wherein the first highly doped area contacts the epitaxial region to form a conduction junction of the first diode.

7. The protection structure of claim 1, wherein the first region contacts the second region to form a conduction junction of the first diode so that the first diode is not formed through the epitaxial region.

8. The protection structure of claim 7, wherein the epitaxial region is disposed between the conduction junction and the substrate.

9. The protection structure of claim 1, wherein the second region includes a highly doped buried layer contacting the substrate.

10. The protection structure of claim 9, further comprising:

a lowly doped region of the first conductivity type disposed between the epitaxial region and the substrate to form a boundary therebetween.

11. The protection structure of claim 10, wherein each of the epitaxial region and the lowly doped region has a doping concentration that is highest along the boundary.

12. The protection structure of claim 1, wherein the integrated circuit further includes a third pad to receive a second supply voltage, the protection structure further comprising:

a second diode coupled between the first and third pads.

13. The protection structure of claim 1 in combination with the integrated circuit, wherein the integrated circuit further includes a component disposed adjacent the protection structure, wherein the protection structure includes a first portion having a first conduction junction with a first voltage threshold and a second portion having a second conduction junction with a second voltage threshold, and wherein the first and second voltage thresholds are different.

14. The combination of claim 13, wherein the protection structure is arranged so that carrier flow occurs only in the second portion when a voltage having a value between the first and second thresholds is applied to the first pad.

15. The combination of claim 13, wherein the protection structure is arranged so that carrier flow does not occur in the first portion when a voltage having a value between the first and second thresholds is applied to the first pad.

16. The protection structure of claim 1, wherein the second region contacts the epitaxial region to form a conduction junction, and wherein at least a portion of the epitaxial region is disposed between the conduction junction and the substrate.

17. The protection structure of claim 1, wherein the contiguous epitaxial region that contacts the first and second regions further contacts the substrate, and wherein the contiguous epitaxial region includes an uninterrupted path of lowly doped semiconductor material of the first conductivity type to provide a conduction path between the first and second regions.

18. An integrated circuit comprising:

a first power pad;

a second power pad;

a third pad to receive a signal; and a protection structure that protects the third pad, the protection structure including a plurality of regions including a plurality of P regions and a plurality of N regions that together form a plurality of PN junctions, each of the plurality of PN junctions being formed at a physical intersection between one of the plurality of P regions and one of the plurality of N regions, at least one of the plurality of regions being a lowly doped region, the protection structure being arranged so that every path between the first power pad and the second power pad passes through the lowly doped region and at least three of the plurality of PN junctions, wherein at least one of the plurality of regions forms a portion of a diode disposed between the second power pad and the third pad to protect the third pad, wherein another one of the plurality of regions forms a substrate such that the diode is disposed outside the substrate, and wherein the plurality of regions is arranged to prevent carrier flow from the diode from causing a latch-up condition between the first power pad and the second power pad.

19. The integrated circuit of claim 18, and wherein the plurality of regions is arranged such that carrier flow from the diode does not pass through the substrate.

20. The integrated circuit of claim 19, wherein the lowly doped region is a portion of an epitaxial layer contacting the substrate, and wherein carrier flow from the diode is directed through the portion of the epitaxial layer so that the carrier flow does not pass through the substrate.

21. A method for protecting a signal pad of an integrated circuit, the signal pad being adapted to receive a signal, the integrated circuit including a first power pad to receive a first supply reference, and a second power pad to receive a second supply reference, the method comprising the step of:

forming a protection structure including a plurality of regions including a plurality of P regions and a plurality of N regions that together form a plurality of PN junctions, each of the plurality of PN junctions being formed at a physical intersection between one of the plurality of P regions and one of the plurality of N regions, at least one of the plurality of regions being a lowly doped region, the protection structure being arranged so that every path between the first power pad and the second power pad passes through the lowly doped region and at least three of the plurality of PN junctions, wherein at least one of the plurality of regions forms a portion of a diode in the integrated circuit between the signal pad and the first power pad to protect the signal pad, wherein another one of the plurality of regions forms a substrate such that the diode is disposed outside the substrate, the diode being disposed so that when the diode is activated, carrier flow from the diode cannot cause a latch-up condition between the first power pad and the second power pad.

22. The method of claim 21, wherein the substrate has a first doping concentration, and wherein the step of forming includes a step of:

providing, as the lowly doped region, an epitaxial region of an epitaxial layer that contacts the substrate, the epitaxial region having a second doping concentration that is higher than the first doping concentration so that a conducting path of the diode is formed outside the substrate and through the epitaxial region.

23. The method of claim 21, wherein the step of forming includes a step of:

providing, as the lowly doped region, at least a portion of an epitaxial layer between a conduction junction of the diode and the substrate.

24. The method of claim 21, wherein the step of forming includes steps of:

providing a buried layer that contacts the substrate; and providing, as the lowly doped region, an epitaxial region of an epitaxial layer that contacts the buried layer so that the buried layer is disposed between the epitaxial region and the substrate to form a conducting path of the diode that is outside the substrate and through a boundary between the epitaxial region and the buried layer.

25. An integrated circuit, comprising:

a first pad to receive a signal;

a second power pad to a receive a supply reference;

a component; and a protection structure, coupled between the first pad and the second power pad, that protects the first pad, the protection structure including a first portion adjacent the component and a second portion, wherein the first portion has a first conduction junction with a first voltage threshold, wherein the second portion has a second conduction junction with a second voltage threshold, and wherein the first and the second voltage thresholds are different.

26. The integrated circuit of claim 25, wherein the protection structure is arranged so that carrier flow through the protection structure occurs only through the second portion when a voltage having a value between the first and second thresholds is applied to the first pad.

27. The integrated circuit of claim 25, wherein the protection structure is arranged so that carrier flow does not occur through the first portion of the protection structure when a voltage having a value between the first and second thresholds is applied to the first pad.

28. A protection structure for protecting a first pad of an integrated circuit, the integrated circuit having a second pad to receive a supply voltage, the protection structure comprising:

a first region of a first conductivity type coupled to the first pad;

a second region of a second conductivity type having a first highly doped area coupled to the second pad and a lowly doped area; and a substrate of the second conductivity type contacting the first and second regions, wherein the lowly doped area of the second region is disposed between the first highly doped area of the second region and the substrate, and wherein a diode is formed outside the substrate between the first and second regions.

29. The protection structure of claim 28, wherein the second region further includes a second highly doped area disposed between the lowly doped area and the substrate.

30. The protection structure of claim 29, wherein both the first highly doped area and the lowly doped area are diffusion areas, and the second highly doped area is a buried area.

* * * * *